United States Patent

Pappert et al.

[19]

[11] Patent Number: 5,929,650
[45] Date of Patent: Jul. 27, 1999

[54] METHOD AND APPARATUS FOR PERFORMING OPERATIVE TESTING ON AN INTEGRATED CIRCUIT

[75] Inventors: Bernard J. Pappert; Clark Shepard; Alfred Larry Crouch; Robert Ash, all of Austin, Tex.

[73] Assignee: Motorola, Inc., Schaumburg, Ill.

[21] Appl. No.: 08/795,030

[22] Filed: Feb. 4, 1997

[51] Int. Cl.⁶ .................................................. G01R 31/28
[52] U.S. Cl. .................... 324/763; 324/765; 395/183.01
[58] Field of Search .................... 324/765, 769, 324/763; 438/14, 15, 16, 17, 18; 395/183.01, 183.06, 183.07; 371/22.5, 22.6

[56] References Cited

U.S. PATENT DOCUMENTS

| | | | |
|---|---|---|---|
| 4,961,053 | 10/1990 | Krug | 324/759 |
| 5,389,556 | 2/1995 | Rostoker et al. | 437/8 |
| 5,442,282 | 8/1995 | Rostoker et al. | 324/158.1 |

OTHER PUBLICATIONS

Hsue, et al., "Built–In Current Sensor For IDDQ Test In CMOS," International Test Conf., pp. 635–641 (1993).

Rius, et al., "Proportional BIC Sensor For Current Testing," Electronic Testing: Theory and Appl. vol. 3; pp. 387–396 (1992).

Rubio, et al., "A Built–In Quiescent Current Monitor For CMOS VLSI Circuits," Eur. Design and Test Conf., pp. 581–585 (1995).

Maly, et al., "Built In Current Testing," J. Solid–State Circuits, vol. 27, No. 3., pp. 425–428 (1992).

Keating, et al., "A New Approach To Dynamic IDD Testing," International Test Conf., pp. 316–321 (1987).

*Primary Examiner*—Ernest F. Karlsen
*Attorney, Agent, or Firm*—Sandra L. Godsey; Daniel D. Hill

[57] ABSTRACT

A method of detecting defective CMOS devices by quiescent current (IDDQ) behavior using a monitor circuit resident in the expendable areas of a die and/or wafer. One embodiment of the present invention incorporates a monitor unit (10) into the scribe grid of a wafer, where pads (2, 3, 4) are built in the corners of the die (5) and connected to the monitor unit (10) via metal connects in the wafer. The monitor unit (10) determines defective die based on IDDQ as expressed by decay of voltage (Vdd) in time, where Vdd is supplied to a die by way of a switch (20) in the monitor unit (10). Alternate embodiments incorporate various configurations and incorporate functional and other tests into a wafer level test system. Other embodiments provide the monitor unit on the die, allowing for later testing and user confirmation.

47 Claims, 8 Drawing Sheets

METHOD AND APPARATUS FOR PERFORMING OPERATIVE TESTING ON AN INTEGRATED CIRCUIT

RELATED CO-PENDING APPLICATIONS

The present application is related to the following U.S. patent application.

"Current Monitor Circuit", invented by Bernard Pappert, et al., Attorney Docket No. SC-90279A, filed concurrently herewith, and assigned to the assignee hereof.

FIELD OF THE INVENTION

This invention relates to testing of an integrated circuit, and specifically to quiescent current testing and wafer level testing.

BACKGROUND OF THE INVENTION

When a complimentary metal oxide semiconductor (CMOS) circuit is in a quiescent state, ideally no current is drawn from the power source by the circuit. A defective CMOS logic device may tend to draw current from the power source. In theory, it is possible to characterize a CMOS logic device by measuring the quiescent drain (source) current IDDQ and find such a defective device. Although a defective CMOS device may exhibit abnormal behavior in its transient current, it is generally anticipated that the abnormal transient current due to a defective individual gate will be masked by the overall circuit transient current. Of course it is possible to build a current detector for almost every logic gate so that an abnormal transient current can become detectable and the test speed improved. However, such an approach would require much overhead and is probably impractical in application.

There is much information regarding various prior art quiescent current testing methods, including : "A Built-In Current Monitor for CMOS VLSI Circuits", by A. Rubio, et al., published by IEEE in 1995 at the European Design and Test Conference held in Paris, France; "Built-in Current Testing, by W. Maly and M. Patyra, published in the IEEE Journal of Solid State Circuits, Vol. 27, No. 3, Mar. 1992; "Proportional BIC Sensor for Current Testing" by J. Rius and J. Figueras, published in Journal of Electronic Testing, Theory and Applications, 1992; and "Built-In Current Sensor for IDDQ Test in CMOS" by C. Hsue and C. Lin, published by AT&T Bell Laboratories in Princeton, NJ, from the International Test Conference 1993.

As seen in the prior art, quiescent current testing is efficient in CMOS digital circuits, offering high coverage levels for detecting significant defects and requiring only a reduced number of test vectors. On-chip built-in current sensors have some advantages over the off-chip alternatives, as on-chip sensors are able to detect defective quiescent current levels with more discrimination and at relatively higher test speeds. The design of reliable circuits has become a key point in the application of current testing techniques. Quiescent current testing circuits have been evaluated for use in testing very large scale integrated (VLSI) CMOS circuits. A significant set of sensor developments are available.

The current of a static CMOS cell is not constant through time. When an output clock transition occurs, a peak of IDD current is observed. This peak is due to the charging and discharging of the load capacitance at the output circuit nodes and additionally to the overlap current through the PMOS and NMOS transistors in the circuit portion changing state. When the transition is completed, the cell is in the quiescence state and, in practice, IDD is near to zero and remains in this range until a new transition occurs. The quiescent current is very sensitive to circuit degradation and other defects which generate IDDQ many orders of magnitude greater than the normal IDDQ. This characteristic is applied to detect defects by use of IDDQ current.

Figure 2:
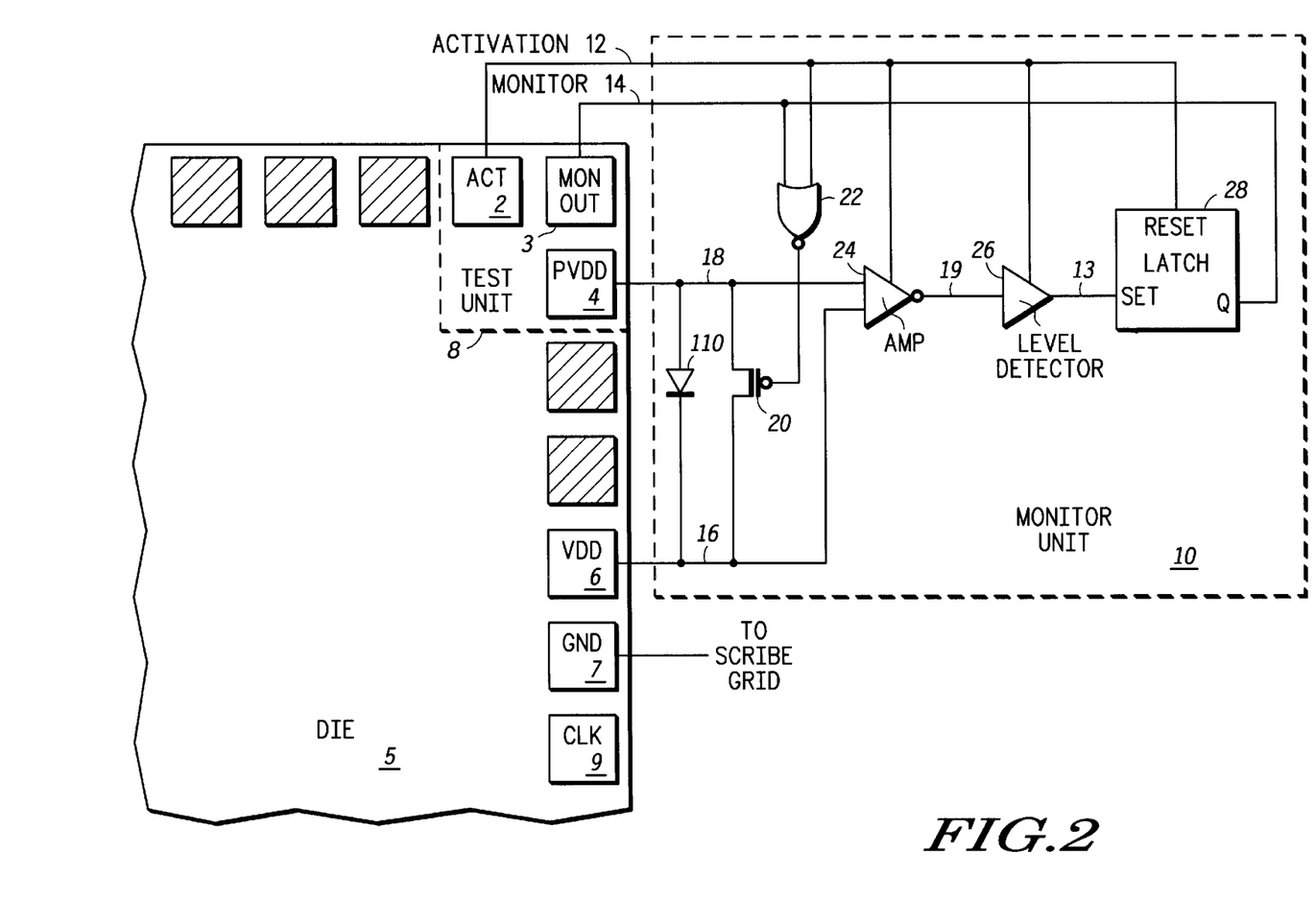
FIG. 2 illustrates, in circuit diagram form, a detailed portion of the test system of FIG. 1, having a test unit contained within the die and a monitor unit external to the die, in accordance with one embodiment of the present invention.

Basically the measurement of the defective current of a device is obtained through observation of the degraded level of the device Vdd. This is due to the discharge of the parasitic capacitance of the power supply line of the device, Vdd. Referring to FIG. 2, IDDQ current measurements require an additional Vdd pad or a pseudo Vdd (PVdd) to supply dynamic current through a switch, illustrated in FIG. 2 as switch 20. Two external digital signals, activation 12 and monitor 14 are used to determine a delay time indicative of a defective current. Note that the circuit labeled monitor label 10 in FIG. 2 may be repeated for every Vdd pin on the chip.

Quiescent current measurements and tests offer information regarding many aspects of the CMOS device. It is desirable to streamline device testing and specifically the quiescent current testing by reducing the hardware associated with the testing as well as reducing the time required for such tests. It is also desirable to expand quiesent testing and so reduce the number of tests required to guarantee fault coverage.

OPERATION OF THE INVENTION

General: In the following description, numerous specific details are set forth such as specific timing, word or byte lengths, etc. to provide a thorough understanding of the present invention. However, it will be obvious to those skilled in the art that the present invention may be practiced without such specific details. In other instances, circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

The term "bus" will be used to refer to a plurality of signals or conductors which may be used to transfer one or more various types of information, such as data, addresses, control, or status. The terms "assert" and "negate" will be used when referring to the rendering of a signal, status bit, or similar apparatus into its logically true or logically false state, respectively. If the logically true state is a logic level one, the logically false state will be a logic level zero. And if the logically true state is a logic level zero, the logically false state will be a logic level one.

For purposes of identification and continuity, pads or pins having multiplexed functions and/or multiple names, such as a pad used for both pseudo Vdd and output (PVdd/OUT0), may be referred to by any or all applicable names, with multiple names separated for clarity. The absence of any or all applicable names does not assume the absence of any function or characteristic of the pad or pin.

It will be appreciated that for simplicity and clarity of illustration, elements illustrated have not necessarily been drawn to scale. For example, the dimensions of some of the elements are exaggerated relative to other elements for clarity. Further, where considered appropriate, reference numerals have been repeated to indicate corresponding or analogous elements.

Operation: The present invention offers a quiescent current testing method that expands the prior art test coverage and reduces the number of conventional test vectors necessary to perform the tests. The present invention is particularly applicable to large integrated circuits where the number of switches required by the prior art is prohibitive. In one embodiment of the present invention applied to wafer level testing, a test circuit is built in the scribe grid, eliminating the need to use precious silicon area on the integrated circuit for testing circuits. The present invention offers a method of implementing quiescent current testing which requires a single pin to provide power to the device. An alternate embodiment of the present invention allows parallel switches to be implemented by using the large P-channel pull-ups associated with the port pins. An alternate embodiment of the present invention incorporates a linear feed-back shift register (LFSR) for provision of test signals to the integrated circuit. A second LFSR may be used for confirmation or signature analysis of test results. Either or both LFSRs may be contained in the scribe grid.

In one embodiment of the present invention, the current monitor, test stimulus generator, response analyzer, and clock are all external to the circuit under test (CUT), reducing the Silicon area necessary for test implementation. For wafer level testing, the unused area of the scribe is used for testing and then discarded during die assembly. Advantages of such a testing method include the increased chip area available for designed integrated circuits, the availability of variable frequency control which allows the die to be tested at a higher frequency than is typically available at wafer level test (i.e. the speed of the device tester), and the ability to use a monitor circuit in the scribe for testing of multiple integrated circuits.

An alternate embodiment of the present invention utilizes those die areas which are unused due to the configuration constraints of packaging and other issues. For example, typically the corners are unavailable for bond out due to thermal and mechanical stresses, which often result in passivation cracking and other reliability issues. The use of these expendable portions of the die allows for efficient testing that does not impinge on the functionality or available circuit area of the device. Use of expendable areas also allows an enhanced built-in-self-test (BIST) extending the application beyond wafer level testing. BIST is valuable to the end user as well as for factory testing. In one embodiment, the current monitor, stimulus generator, response analyzer and clock are all resident on the integrated circuit, simplifying device test by reducing the number of test vectors.

Still another embodiment of the present invention incorporates the current monitor into the scribe grid while placing the stimulus generator and clock on the die. There are many variations to the present invention which are available to the designer and end user.

DETAILED DESCRIPTION OF THE DRAWINGS

Figure 1:
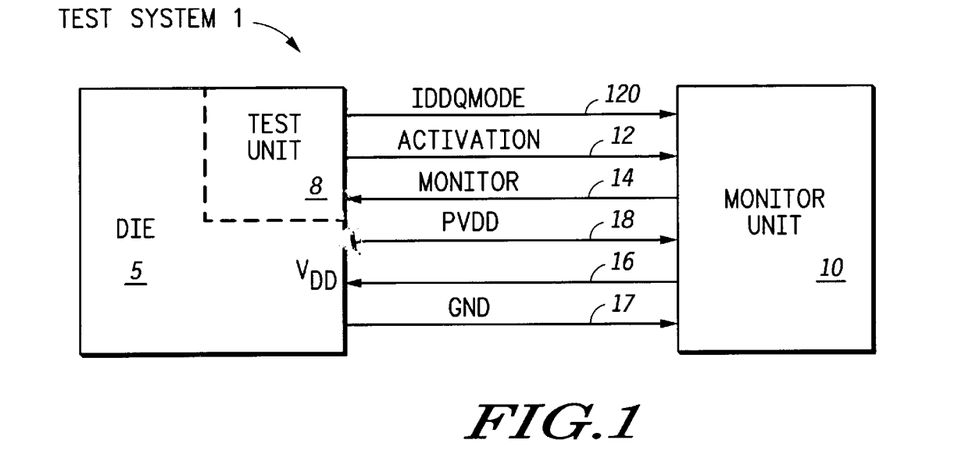
FIG. 1 illustrates, in block diagram form, a test system in accordance with one embodiment of the present invention.

FIG. 1 illustrates a test system 1 having a die 5 and a monitor unit 10. Die 5 contains test unit 8 in a corner of the die and has at least one voltage supply Vdd. Monitor unit 10 supplies supply voltage, Vdd, to die 5 by way of conductor 16 and ground is provided to monitor unit 10 by way of conductor 17. Die 5 provides an activation signal to monitor unit 10 by way of conductor 12. The activation signal is provided by test unit 8. Test unit 8 receives a monitor signal via conductor 14 from monitor unit 10. Test unit 8 provides a pseudo Vdd or "PVdd" by way of conductor 18 to monitor unit 10. In one embodiment of the present invention, die 5 provides an IDDQ mode signal to monitor unit 10. Additionally, die 5 provides an IDDQMODE signal on conductor 120 to monitor unit 10. IDDQMODE signal indicates when die 5 is operating and configured for IDDQ testing.

Monitor unit 10 is capable of performing quiescent testing on die 5. The circuit portion of die 5 that is to be tested is referred to as the circuit under test or "CUT".

FIG. 2 illustrates one embodiment of the present invention where monitor unit 10 is as described in detail in the aforementioned paper by Rubio. Die 5 has Vdd bond pad 6 and ground bond pad 7 coupled to monitor unit 10. Vdd 6 is coupled to monitoring unit 10 by conductor 16. In one embodiment of the present invention conductor 16 is formed on the wafer by connecting through a metal layer. In an alternate embodiment, conductor 16 is a short circuit provided by way of the probe card. Conductor 16 illustrated as in FIG. 2 is provided through the scribe grid. Note that monitor unit 10 is resident in the scribe grid. Die 5 also contains additional bond pads illustrated with cross hatching, not directly associated with quiescent testing. Note that these additional bond pads 9 are used to perform other functions consistent with operation of die 5.

In one embodiment of the present invention, the upper corner of die 5 defines test unit 8. Test unit 8 is formed in the expendable portion of die 5, as the corner is typically not bonded out and represents wasted area. Test unit 8 contains bond pads ACT 2, MONOUT 3, and PVdd 4. ACT 2 is coupled to monitor unit 10 by way of conductor 12, which is used to provide an activation signal. Test unit 8 provides the activation signal to gate 22, amplifier 24, level detector 26, and latch 28. In one embodiment of the present invention, PVdd 4 powers all circuitry in monitor unit 10 of FIG. 2. Note that gate 22 is a NOR gate, and an activation signal is provided to the reset input of latch 28. MONOUT 3 is coupled to monitor unit 10 by way of conductor 14, which allows test unit 8 to receive a monitor signal. The monitor signal is provided as an output of latch 28. PVdd 4 is coupled to monitor unit 10 by way of conductor 18. PVdd 4 is a pseudo Vdd coupled to switch 20 and amplifier 24 of monitor unit 10. Note that the PVdd 4 is coupled to Vdd 6 through monitor unit 10 in the scribe grid. Conductor 16 also is coupled to an input of amplifier 24. Amplifier 24 is coupled to level detector 26 by way of conductor 19. Level detector 26 is then coupled to latch 28 by way of conductor 13.

Figure 3:
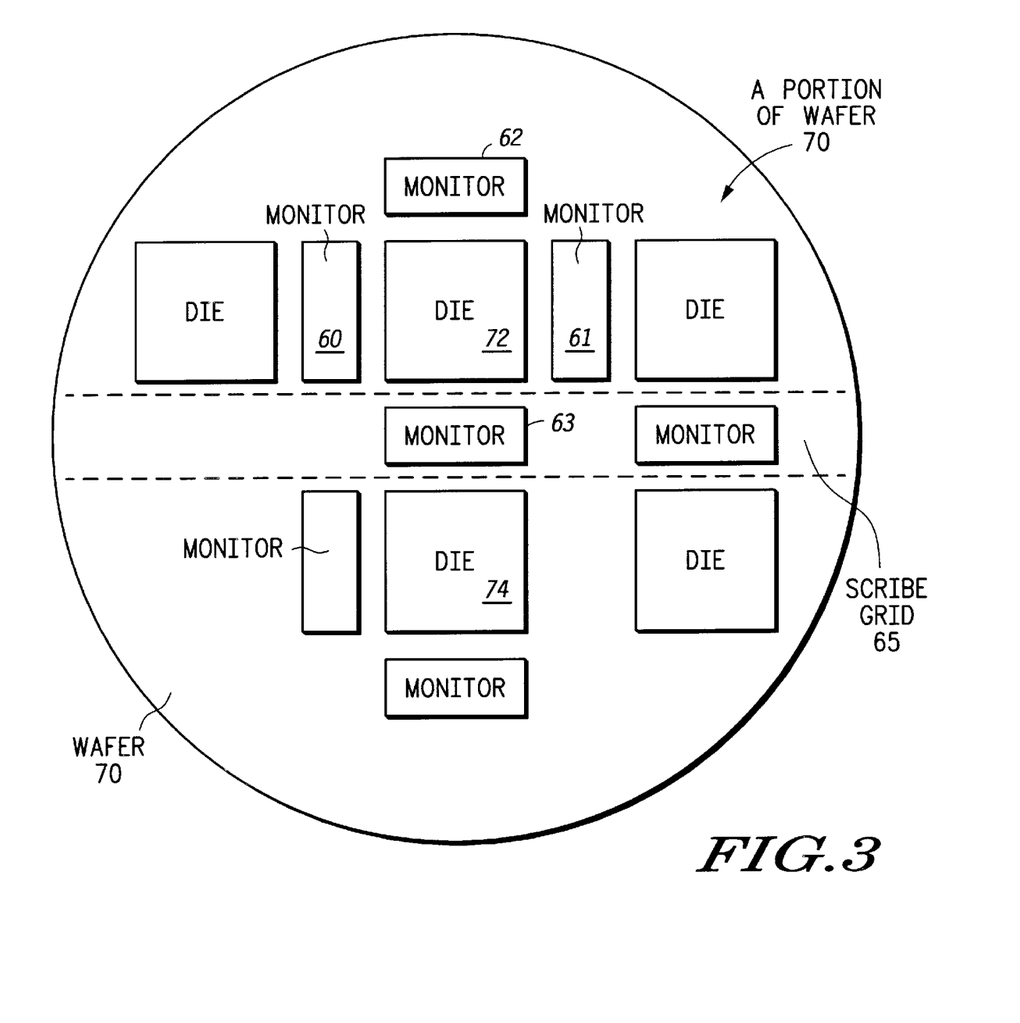
FIG. 3 illustrates, in block diagram form, a portion of a wafer having monitors contained in the scribe grid, in accordance with one embodiment of the present invention.

FIG. 3 illustrates the configuration of die and monitors on a portion of wafer 70. Wafer 70 is formed by a plurality of die in a layout defined by scribe grid 65. Here die 72 is an example of the die built on wafer 70. Die 72 is surrounded by four monitor units, 60, 61, 62, 63. Note that within the parameters of wafer 70, each die has at least one adjacent monitor unit. Alternate embodiments incorporate various configurations, some requiring fewer monitor units. Each monitor unit is contained in the scribe grid. Each monitor unit is similar to monitor unit 10. Monitor 63 is situated between die 72 and die 74. In one embodiment of the present invention, monitor 63 is used for testing die 72 and testing die 74. In other words, monitor 63 is available for testing die 72 and/or die 74. In an alternate embodiment, monitor 63 is used exclusively for testing die 74 and monitor 62 is used exclusively for testing die 72. In one embodiment of the present invention, monitor units, 60, 61, 62, 63 each represent a composite unit containing elements of test unit 8 and of monitor unit 10 according to FIG. 1.

Note that other embodiments may incorporate any number of monitors, and may incorporate alternate embodiments of monitor unit 10. Note that monitors 60, 61, 62, 63 are each contained within scribe grid 65. In one embodiment of the present invention, monitors 60, 61, 62, 63 are all used for testing die 72, where each individual die is tested using the monitor units on each side allowing full coverage of large die with excessive power demands on any single unit. Note that custom configurations allow accommodation of various wafer geometries.

Figure 4:
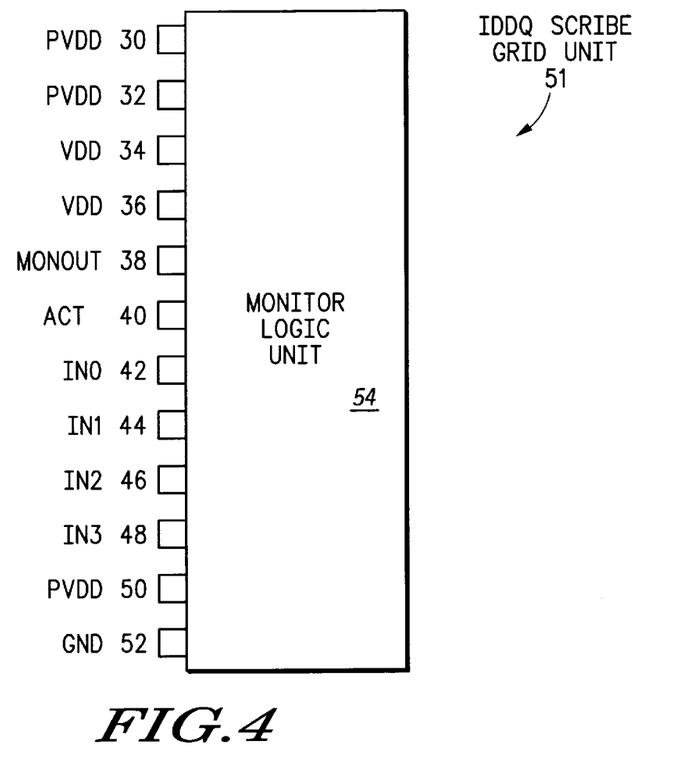
FIG. 4 illustrates, in block diagram form, quiescent current scribe grid unit, in accordance with one embodiment of the present invention.

Continuing to FIG. 4, FIG. 4 illustrates one embodiment of monitor unit 10, IDDQ scribe grid unit 51, located in scribe grid 65. Monitor logic unit 54 is a part of IDDQ scribe grid unit 51. Adjacent to monitor logic unit 54 are several pads including PVdd 30, 32, 50, Vdd 34, 36, MONOUT 38, ACT 40, IN0 42, IN1 44, IN2 46, IN3 48, and GND 52. In the embodiment illustrated in FIG. 4, IDDQ scribe grid unit 51 includes the pads illustrated as included in test unit 8 of FIG. 2. As illustrated in FIG. 2, pads ACT 2, MONOUT 3 and PVdd 4 correspond to ACT 40, MONOUT 38, and PVdd 50 of FIG. 4 respectively. In IDDQ scribe grid unit 51, Vdd 34, Vdd 36, and GND 52 are shorted to the corresponding power supply and ground pins on the device to be tested. The embodiment illustrated in FIG. 4 does not require the additional pads added in test unit 8 of FIG. 1, but utilizes the expendable area of the scribe grid for implementation of pads for test. In one embodiment of the present invention, monitor logic unit 54 is a composite of elements contained in test unit 8 and monitor unit 10 according to FIG. 1.

Figure 5:
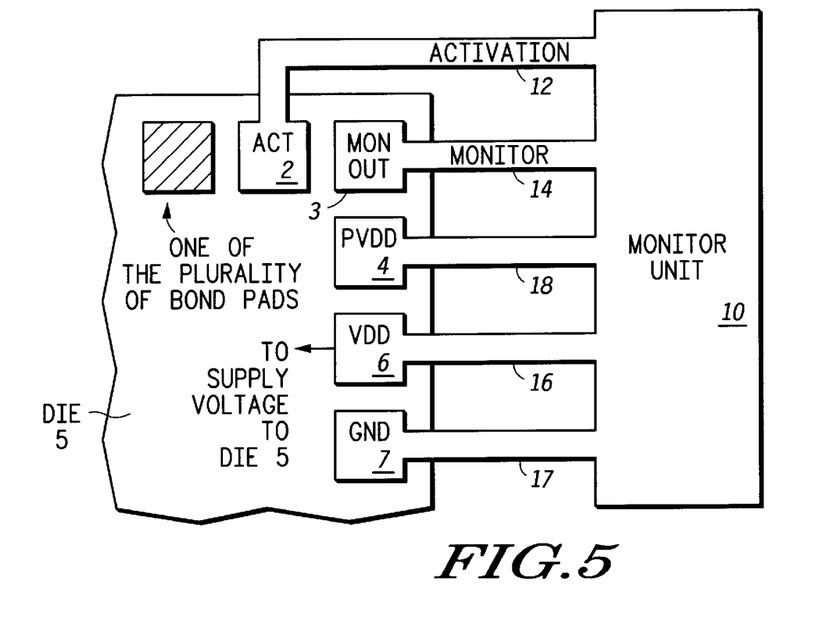
FIG. 5 illustrates, in block diagram form, a wafer having a die and a monitor unit, in accordance with one embodiment of the present invention.

FIG. 5 illustrates a test system, according to FIG. 2, where ACT 2, MONOUT 3, PVdd 4, Vdd 6, and GND 7 are each coupled to monitor unit 10. In one embodiment the connection is made from each of ACT 2, MONOUT 3, PVdd 4, Vdd 6, and GND 7 to monitor unit 10 by specifically providing a path from each individual pad to the edge of the die and then bridging through at least one layer of the scribe to meet monitor unit 10. For continuity, the other bond pads are represented by cross hatching. The test system of FIG. 5 may implement the necessary switches by dedicated switches on the die, switches external to the die or by a configuration hardwired to an input/output (I/O) ring on the die.

Referring to the embodiments illustrated in FIGS. 1, 2, and 5, wafer level testing is accomplished by placing test unit 8 in at least one corner of die 5. This is advantageous as the corner pads are typically not bonded out and generally considered expendable. Note that alternative embodiments of the present invention include placing the pads illustrated as part of test unit 8, specifically ACT 2, MONOUT 3, and PVdd 4, external to die 5.

Regarding the layout of monitor unit 10 in FIG. 2, note that most of the area within monitor unit 10 is consumed by the size of switch 20 and, as illustrated in FIG. 3, multiples of monitor unit 10 may be applied per die. Multiple monitors allows greater power supply to die 5, which is particularly desirable where die 5 has multiple power supply pads (i.e. Vdd 6). Implementation of multiple monitors allows detection of a defect in die 5 at any monitor where each monitor receives the activation signal. Additionally, under normal test conditions (i.e. non-quiescent Idd testing) monitor unit 10 is effectively eliminated from the test system. Power is then supplied directly to Vdd rather than through the current monitor switch of monitor unit 10. Though alternate embodiments place monitor unit 10 within die 5, placement in the scribe grid typically results in reduced design restrictions and increased test flexibility.

Figure 6:
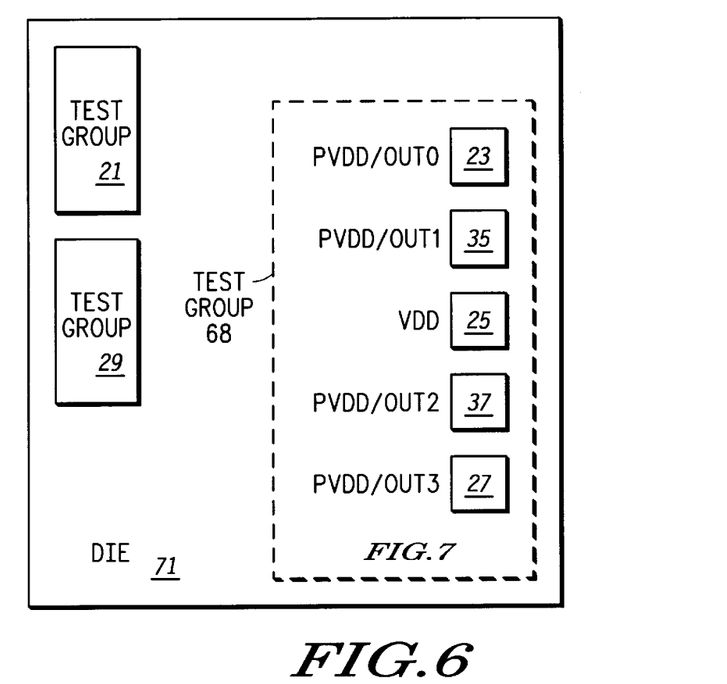
FIG. 6 illustrates, in block diagram form, a die having test groups used for quiescent testing, in accordance with one embodiment of the present invention.
Figure 7:
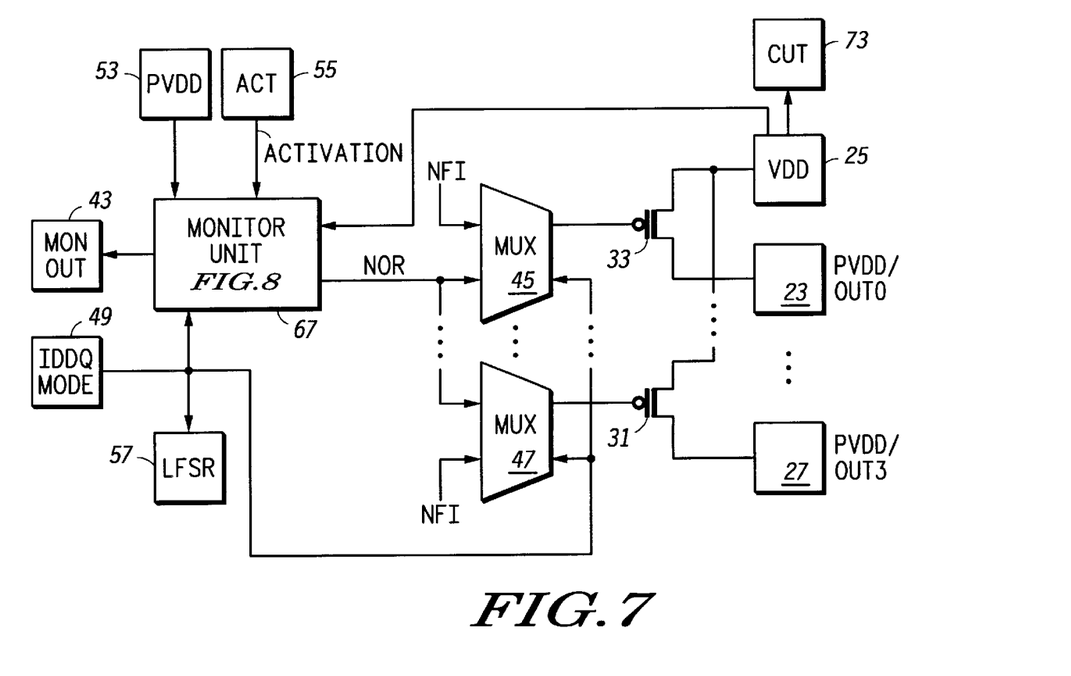
FIG. 7 illustrates, in block diagram form, a portion of the die of FIG. 6 having a monitor unit and logic circuitry for using a test group, in accordance with one embodiment of the present invention.

It is particularly advantageous to utilize the existing pads within die 5. For example, to overcome the disadvantages of adding excessive circuitry within die 5, an alternate embodiment utilizes existing output buffers, which are coupled to output pads, for switching. FIGS. 6 and 7 illustrate the reuse of output buffers.

According to FIG. 6, die 71 includes several test groups 20, 21, and 29. FIG. 7 gives a detailed description of test group 68. As illustrated in FIG. 6, test group 68 includes PVdd/OUT0 23, PVdd/OUT1 35, Vdd 25, PVdd/OUT2 37, and PVdd/OUT3 27. During test, pad 23 is available for use as pseudo Vdd, PVdd, and during normal operation pad 23 is available for as an output, OUT0. The other pads illustrated have similar designation. Similar groupings are placed within test groups 21 and 29. Any number of output pads may be included in a test group. The number of output pads is typically dependent on the placement of Vdd pads. Test groups 20, 21, and 29 reflect the dependence, having the power supply pad, Vdd 25 surrounded by output pads 23, 35, 37, and 27.

Referring now to FIG. 7, a detailed description of one embodiment of test group 68 includes pads 23 to 27. An output, labeled "NOR", of monitor unit 67 is coupled to multiplexers (MUXs) 45 to 47. Multiplexers 45 to 47 each receive a normal functional input (NFI) indicating operation in normal mode, as well as an input from the NOR output. MUX 45 is coupled to output buffer 33, and MUX 47 is coupled to output buffer 31. Monitor unit 67 of the present embodiment is contained within die 71, and uses existing output buffers as switches during testing. Vdd 25 is associated with a plurality of output pads, represented in FIGS. 6 and 7 by PVdd/OUT0 23 through PVdd/OUT3 27. An output buffer is coupled to a power supply pad and an associated output pad, and each output buffer is further coupled to an associated multiplexer. Output buffer 33 is coupled to Vdd 25 and to PVdd/OUT0 23. MUX 45 is coupled to output buffer 33. Similarly, output buffer 31 is coupled to Vdd 25 and to PVdd/OUT3 27. MUX 47 is coupled to output buffer 31. In one embodiment of the present invention, the output N channel stack is turned off when IDDQ mode signal is high during IDDQ testing.

Continuing with FIG. 7, quiescent current testing is controlled by monitor unit 67. Monitor unit controls the MUX 45 through MUX 47, which are associated with output buffer to be used for testing. In one embodiment of the present invention, during quiescent testing monitor unit 67 may force all of output buffer P-channel pull-ups 33 to 31 on or off while disabling output N-channel stack. Also, during quiescent testing PVdd is supplied to pads 23 to 27. For operation outside of quiescent testing normal function input (NFI) signals are provided to multiplexers 45 to 47 and pads 23 to 27 are configured as output pads where no external voltage is supplied to pads 23 to 27.

Figure 8:
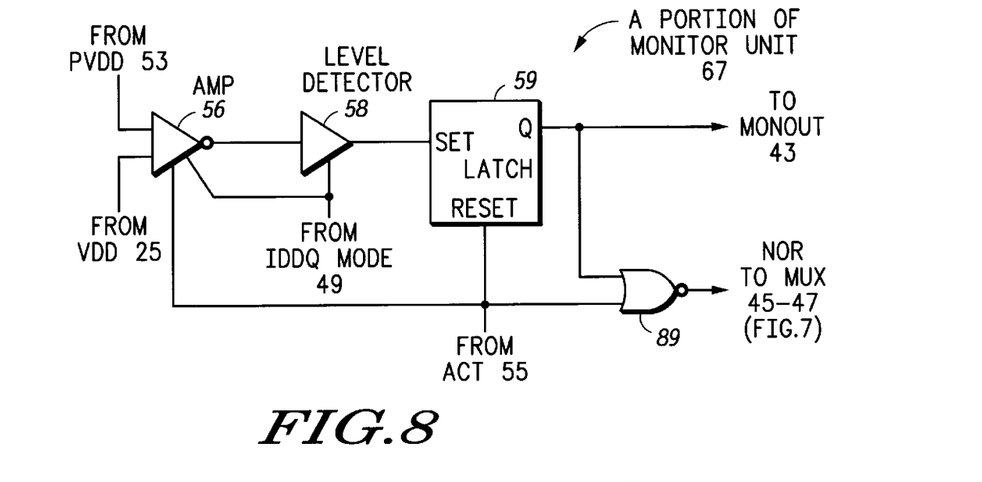
FIG. 8 illustrates, in block diagram form, the monitor unit of FIG. 7, in accordance with one embodiment of the present invention.

Again referring to FIG. 7, Vdd 25 is coupled to monitor unit 67. An activation signal is provided to monitor unit 67 from ACT 55. Monitor unit 67 provides a monitor signal output to MONOUT 43. Refer to FIG. 8 for a detailed description of monitor unit 67. An IDDQ mode signal is provided to monitor unit 67, LFSR 57, and MUX 45–47 from IDDQ MODE 49. Vdd 25 is further coupled to the circuit under test (CUT) 73. Monitor unit 67 is substantially different from monitor unit 10, as monitor unit 10 includes switch 20 and monitor unit 67 utilizes the output buffer associated with pads 23–27 as switches. Monitor 67 allows pseudo Vdd supply from external to die 71 by way of pads 23–27. Note that in one embodiment of the present invention, the well of P-channel switches is tied to Vdd in normal mode and tied to PVdd in IDDQ mode. Alternate methods of muxing the output pins are available and include using otherwise unused I/O pins as multi-purpose pins powered by PVdd.

FIG. 8 offers a more detailed illustration of one circuit embodiment of monitor unit 67 from FIG. 7. Monitor unit 67 receives inputs Vdd, PVdd, IDDQ mode signal, and an activation signal. Monitor unit 67 provides output to MONOUT 43, and provides a NOR signal. Specifically, monitor unit 67 receives IDDQ mode signal as input to level detector 58 from IDDQ MODE 49. The IDDQ mode signal is also provided to Amplifier 56. Amplifier 56 is coupled to level detector 58. Level detector 58 is coupled to latch 59. Latch 59 outputs a monitor signal to MONOUT 43 and to gate 89. Gate 89 also receives an activation signal from ACT 55, and outputs a NOR output to MUXs 45–47. The activation signal from ACT 55 is also provided to the reset of latch 59. Amplifier 56 receives inputs from PVdd 53, and Vdd 25. Activation signal from ACT 55 is provided to Amplifier 56. Note that an alternate embodiment may provide a PVdd signal internally eliminating the need for a separate PVdd pad.

Figure 9:
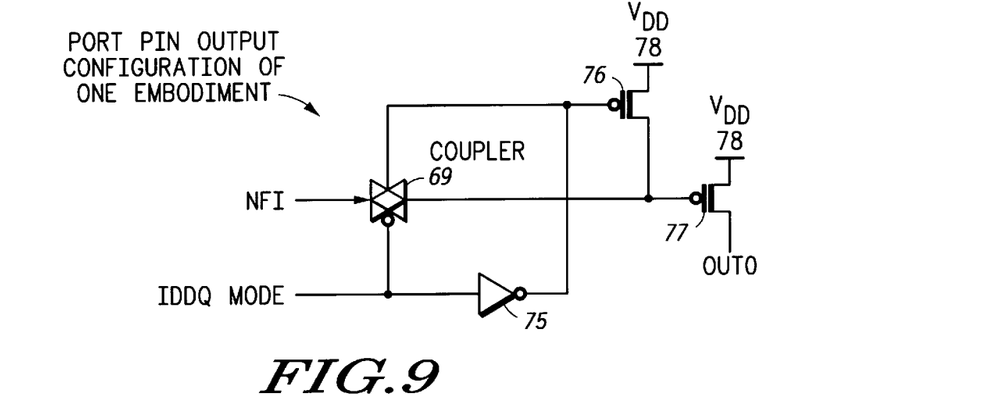
FIG. 9 illustrates, in block diagram form, a portion of the test group of FIG. 7, in accordance with one embodiment of the present invention.

FIG. 9 illustrates a port pin according to an alternate embodiment of the test system of FIG. 2 applied to IDDQ scribe grid unit 51, where a port pin has the pull up disabled. Switch 76 is coupled to Vdd 78 and also to output buffer 77. Output buffer 77 is coupled to Vdd 78 and OUT0. In the alternate embodiment illustrated in FIG. 9, an IDDQ mode signal is provided to coupler 69 and additionally to gate 75, where gate 75 is an inverter. A normal function in (NFI) signal is provided to a CMOS coupler 69, where coupler 69 is coupled to switch 76 and to the output of gate 75. In one embodiment of the present invention, since all output P channel pull ups are disabled during IDDQ testing, and therefore the current supplied through switch 20 to the circuit under test is significantly reduced. The resultant size of switch 20 is thereby reduced, which is highly desirable in circuit design and fabrication.

When an IDDQ mode signal goes low it forces the monitor signal low. Referring again to FIG. 2, note that the activation signal acts to turn switch 20 on and off. Normal testing with power applied at Vdd is done with activation low and switch 20 off. Relaxed normal testing is done with IDDQ mode signal low and activation signal high. Relaxed normal testing is typically done to verify the output buffers within the specified conditions. The low IDDQ mode signal enables P channel pull ups, as in FIG. 9. During relaxed normal testing and during IDDQ testing, power is applied at PVdd, as in FIG. 2. The activation signal is maintained high during relaxed normal testing.

IDDQ testing is performed with IDDQ mode signal high and power applied to PVdd, as in FIG. 2. Where switch 20 is implemented in the expendable portion of the die, or in the scribe grid, then both relaxed normal testing and IDDQ testing are possible with a single probe configuration and a single pass probe testing. Contrast the embodiment illustrated in FIG. 7, which uses output P channel pull ups to implement switch 20 and typically requires at least two probe configurations. IDDQ testing is performed with power applied to PVDD/OUT0 23. Verification of the output is done during normal testing with power applied to VDD 25.

Figure 10:
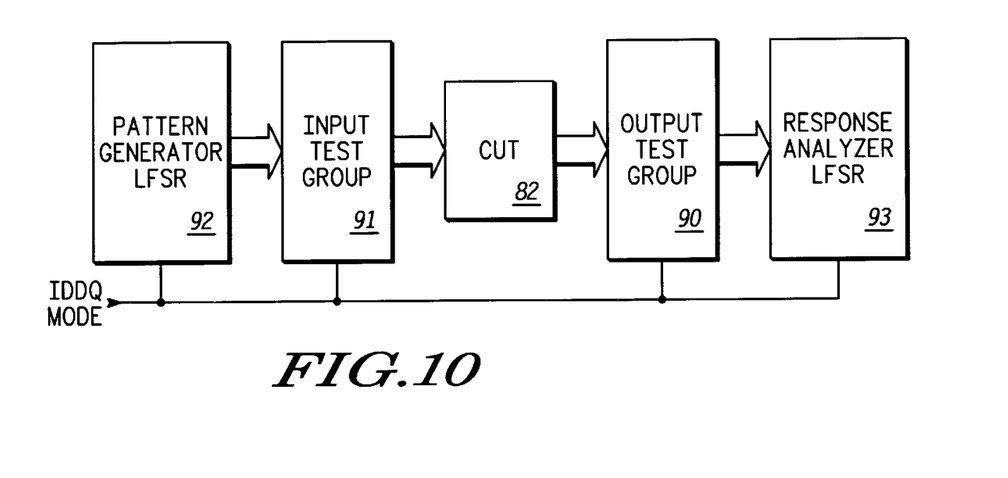
FIG. 10 illustrates, in block diagram form, a test system incorporating a pattern generator and a response analyzer for testing a circuit as in FIG. 7 having an input test group and an output test group, in accordance with one embodiment of the present invention.

FIG. 10 illustrates one embodiment of the present invention where a test system is composed of inputs to a circuit under test and outputs from a circuit under test. The test system of FIG. 10 incorporates linear feed-back shift registers (LFSR) for interfacing with the circuit under test or "CUT". CUT 82 is the circuit to be tested, and for clarity is positioned between the test groups and LFSRs, although there are many other configurations consistent with the present invention. Input test group 91 is used to interface directly with CUT 82. Test pattern generation is provided by LFSR 92, which is coupled to input test group 91 for application to CUT 82. A pattern generator is also referred to as a stimulus generator. Stimulus generation involves a pattern generated by LFSR 92 which provides various voltages and signals to CUT 82 by way of input test group 91. Note that in one embodiment data is provided to LFSR 92, as in FIG. 14. LFSR 92 is used to collapse the stimulus generation, requiring a reduced number of input resources for application to CUT 82.

The patterns, or stimulus, applied to CUT 82 may be provided using a reduced number of input resources, and application methods include serial application. The results, or responses to the testing, are provided as output from CUT 82 to output test group 90. Note that input test group 91 and/or output test group 90 may be resident on the die or alternately may be contained in the scribe grid. Similarly, pattern generator LFSR 92 and/or response analyzer LFSR 93 may be resident on the die or alternately may be contained in the scribe grid. Output test group 90 is further coupled to signature analyzer LFSR 93, also referred to as a response analyzer. LFSR 93 is used to collapse test results or outputs, allowing a signature associated with a sequence of operation to be stored in a storage unit such as a memory location or register, from where it may be serially shifted out.

Figure 11:
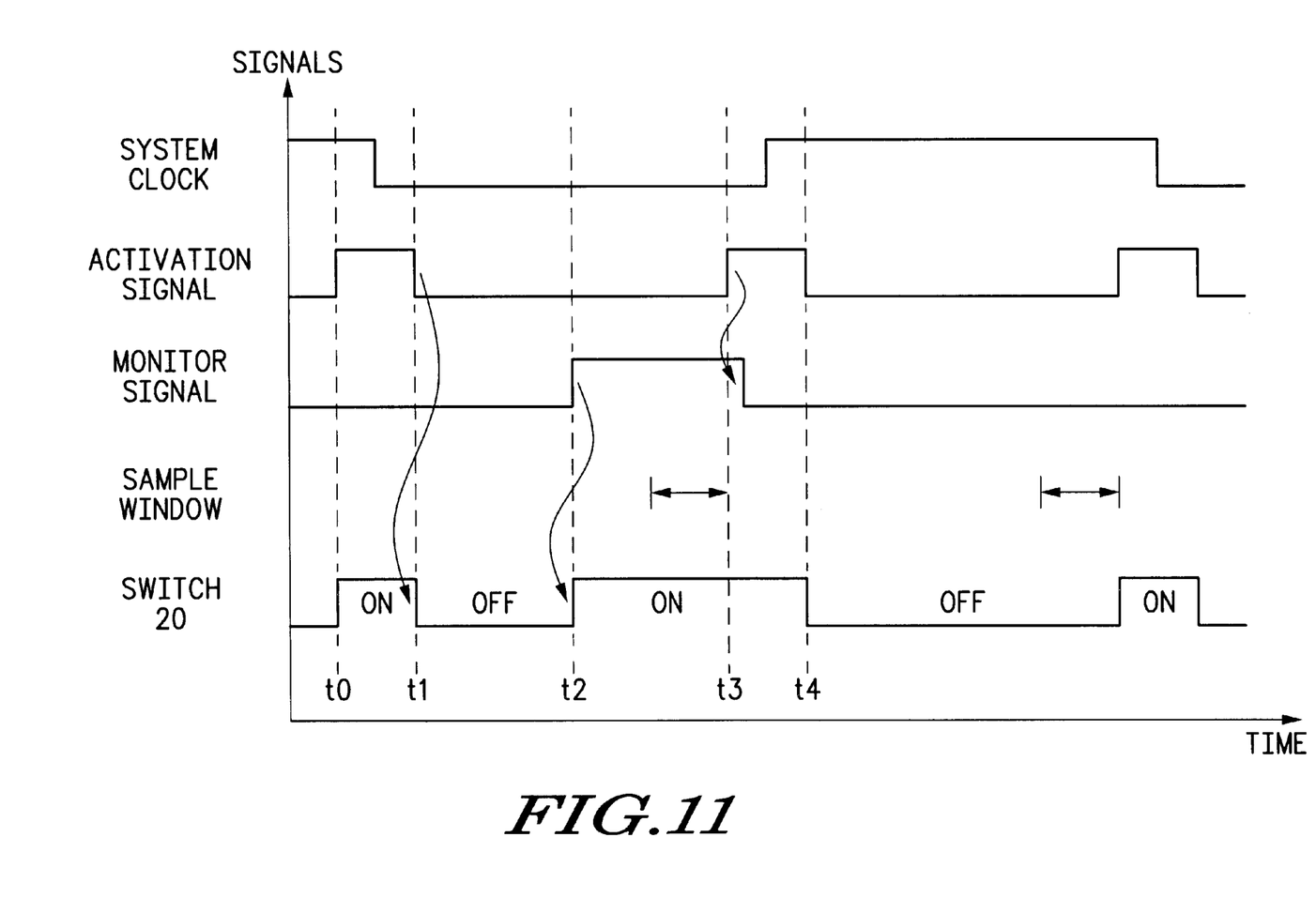
FIG. 11 illustrates, in timing diagram form, the relationship of the activation and monitor signals in analyzing the quiescent current, in accordance with one embodiment of the present invention.

FIG. 11 illustrates a timing diagram associated with one embodiment of the present invention illustrated in FIG. 2. Starting at time to, an activation signal transitions to a high level, which, according to FIG. 2, resets latch 28 and turns switch 20 on. At this time the monitor signal is low. At time $t_1$ activation signal goes low serving to turn switch 20 off, and begin the delay period to be monitored. The monitor delay period ends at time $t_2$ when the monitor signal goes high indicating a defect. Monitor signal transitioning high turns switch 20 ON for recovery. Note that the monitor signal going high indicates a defect in die 5.

Continuing with the timing diagram of FIG. 11, shortly after the activation signal goes high, time $t_3$, the monitor signal goes low again. Note that switch 20 remains ON until time $t_4$. At time $t_4$, the activation signal goes low turning switch 20 OFF. After time $t_4$, the activation signal remains low and the switch remains OFF. As indicated across the top of the timing diagram of FIG. 11, in the illustrated example, the time period to to $t_3$ represents the time when a quiescent IDD is above the desired IDDQ threshold level. For the period following time $t_4$, quiescent IDD is less than the desired IDDQ threshold level. Note that at the end of each activation signal cycle the monitor signal is available for testing during the sample window.

Figure 12:
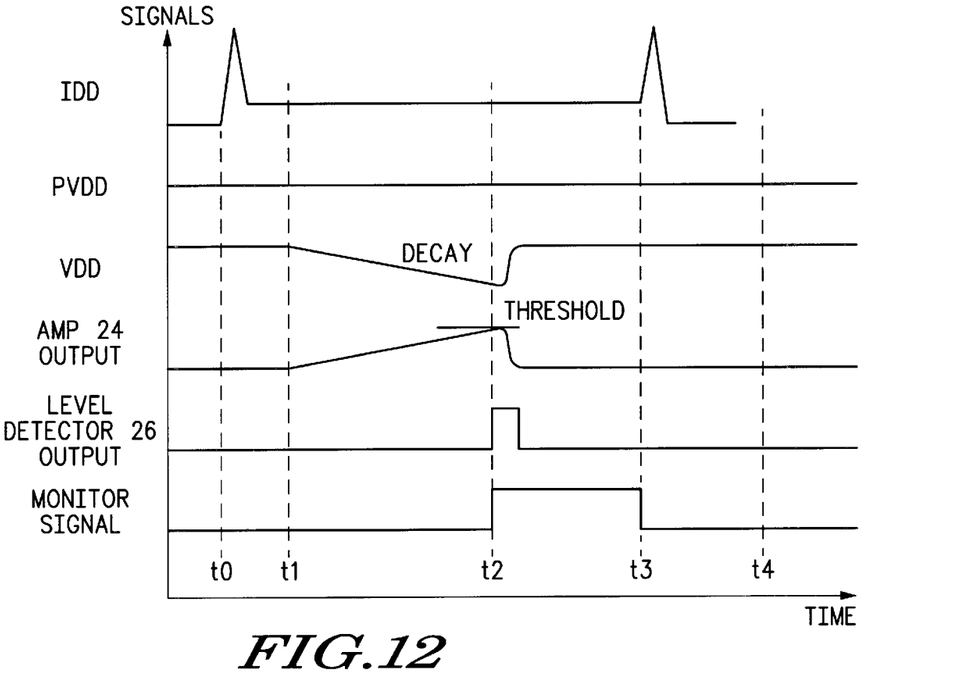
FIG. 12 illustrates, in timing diagram form, the decay and maintenance of Vdd voltage during quiescent current testing, in accordance with one embodiment of the present invention.

FIG. 12 is related to FIG. 11, and illustrates the associated voltages PVdd, Vdd, IDD as well as the output of amplifier 24, the output of level detector 26, and monitor signal. There is a general correspondence of the timing diagram of FIG. 12 to the timing diagram shown in FIG. 11. At time $t_0$ the activation signal is high and switch 20 is turned ON. At this point there is a corresponding spike in IDD, seen in FIG. 12. Beginning at time $t_1$, the Vdd level begins to decay. From time $t_1$, the level output of amplifier 24 begins to increase and reaches a threshold level at time $t_2$. Attainment of the threshold level indicates a failure detection, and results in a high output of level detector 26, with the resultant high monitor signal. Note that the monitor signal remains high until time $t_3$. Subsequent to time $t_2$, the output of amplifier 24 decays below the threshold level. The level detector output is pulsed high at time $t_2$ and goes low during the period from time $t_2$ to time $t_3$.

Referring to FIGS. 2, 11, and 12, the timing diagrams illustrating the operation of one embodiment of the present invention are detailed. In operation, monitor unit 10 is enabled by the activation signal. At the beginning of the monitor signal cycle, which begins at the falling edge of the activation signal, power is disconnected from Vdd by the switch 20, which in one embodiment is a P-channel switch transistor. In the presence of an IDDQ fault, Vdd decays through the anomalous current path, and the amplifier 24 amplifies the difference between the original Vdd level and the decayed Vdd level. The level detector 26 pulses high to SET the IDDQ monitor latch 28. The SET latch 28 then turns switch 20 ON to prevent further decay of Vdd. The rising edge of the activation signal terminates the monitor signal cycle and latch 28 is RESET in preparation for the next cycle.

Figure 13:
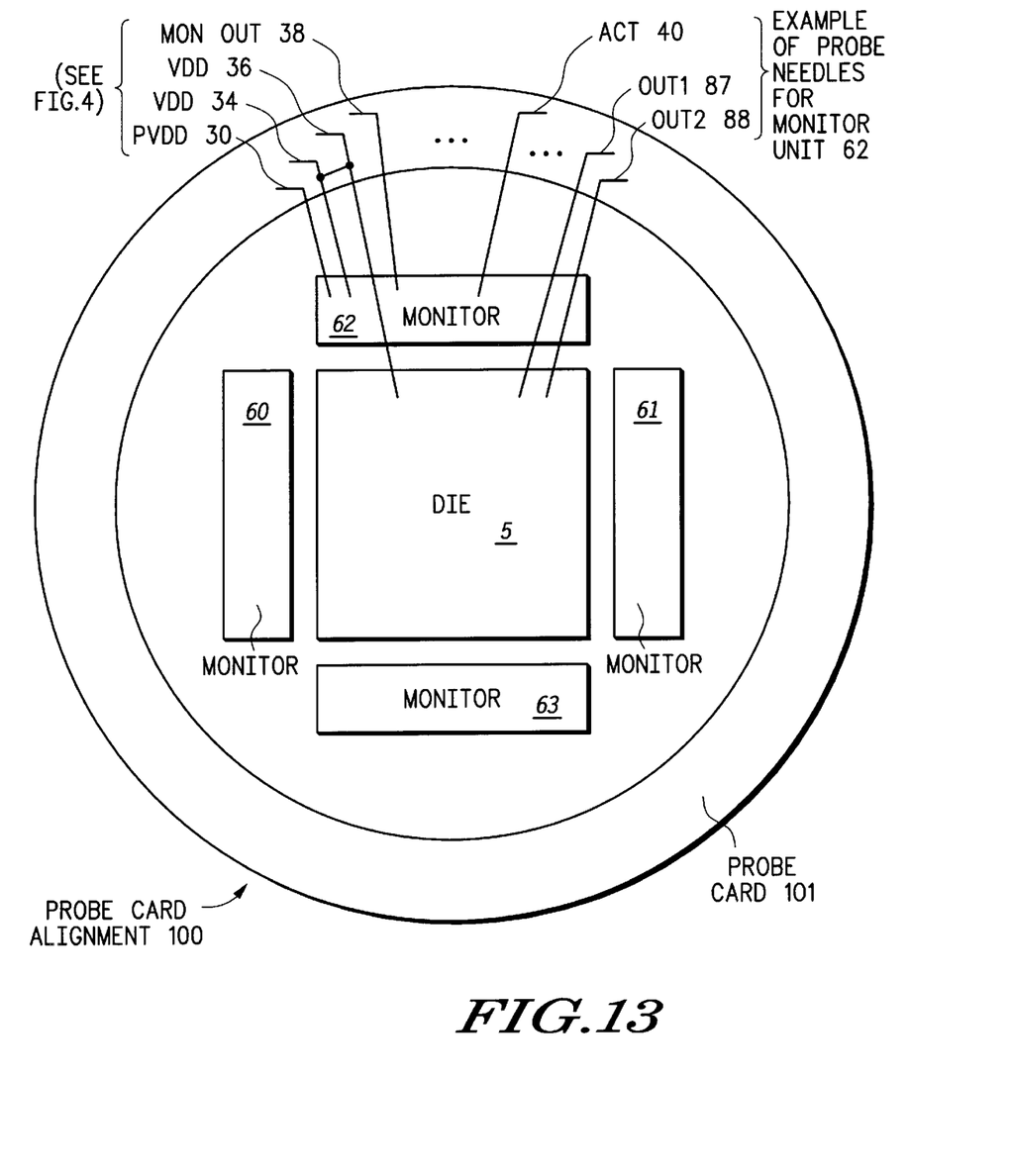
FIG. 13 illustrates, in block diagram form, a probe card implementing quiescent current testing and the alignment of the probe card with a test die on a wafer, in accordance with one embodiment of the present invention.

FIG. 13 illustrates a test set up alignment, according to one embodiment of the present invention, involving testing at the wafer level, referred to as "probe". At probe a probe card is used to interface with the wafer to be tested. The probe card typically consists of contact surfaces, used for supplying and receiving test patterns, power supplies, ground supplies, clock signals, and other signals to the circuit under test during probe testing. The contact surfaces then meet the tester or test system. Connected to the contact pads are pins or needles which are place in alignment with the wafer, so as to match the contacts with their respective pads on the CUT.

FIG. 13 illustrates probe card alignment 100, where probe card 101 contains probe needles corresponding to the pads of IDDQ scribe grid unit 51 of FIG. 4. For clarity and easy comprehension, only a few such needles are illustrated. Specifically, the probe needles of probe card 101 include PVdd 30, Vdd 34,36, MONOUT 38, ACT 40, OUT1 87, OUT2 88. Vdd 34 and 36 are shorted together on probe card 101, and one is aligned to die 5, which contains the CUT, and one is aligned to monitor 62. Note that die 5 is part of a wafer similar to wafer 70 of FIG. 3. Additionally, OUT1 87 and OUT2 88 are aligned to die 5, while the other needles listed above are aligned to monitor 62. The needles illustrated in FIG. 13 are exemplary of similar needles positioned within probe card 101 and aligned to die 5 and monitor 62. Additionally, the needles illustrated represent a portion of probe needles. In an alternate embodiment of the present invention, similar portions of probe needles are positioned around probe card 101 and interface with die 5 and monitor 61, die 5 and monitor 63, as well as die 5 and monitor 60. Still other embodiments incorporate any combination of monitor units 60, 61, 62, and/or 63 with die 5. The placement of portions in various configurations allows for efficient and robust testing of large die, or die that have modules that consume power strategically placed. Additionally, the present invention offers a flexible arranging of such portions of needles, allowing the test environment to accommodate to the various geometries of different die.

Figure 14:
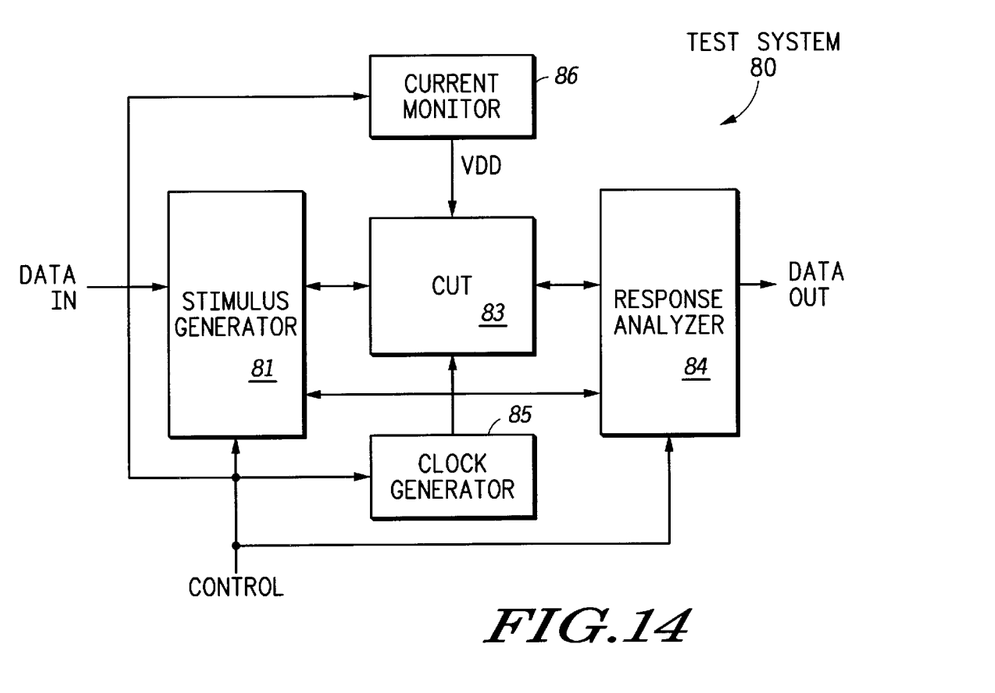
FIG. 14 illustrates, in block diagram form, a test system having a clock generator enabling variable frequency testing, in accordance with one embodiment of the present invention.

An alternate embodiment of the present invention is illustrated in FIG. 14, which is similar to the embodiment illustrated in FIG. 10. Data is provided to stimulus generator 81, which includes a LFSR. Stimulus generator 81 is bi-directionally coupled to CUT 83. CUT 83 is coupled to clock generator 85, which is capable of providing an independent clock signal to CUT. The advantage of the additional clock source is to add frequency flexibility to the testing of CUT 83. Clock generator 85 allows for alternate frequency provision to CUT 83, where the frequency provided may be greater than the maximum frequency available in the tester or test environment. Note that in one embodiment clock generator 85 is a phase locked loop. According to one emodiment clock generator 85 has a variable output associated with an input signal. Alternate frequency generation allows older, slower test environments to perform high performance testing at the ever increasing frequencies of new devices. Generally, a circuit under test must be probed at a lower frequency than a packaged die because of the inductance introduced by the probe needles. Additionally, at wafer level testing it is difficult to attach decoupling capacitors in close proximity to the die with necessary short lead lengths between supply and ground.

Current monitor 86 is coupled to CUT 83 providing a Vdd to CUT 83. Further response analyzer 84 is bi-directionally coupled to CUT 83. Response analyzer 84 then provides data out. In one embodiment of the present invention, data out is a serial output. A control signal is used for control of the test system, and specifically stimulus generator 81, current monitor 86, response analyzer 84 and clock generator 85. In one embodiment of the present invention illustrated in FIG. 14, stimulus generator 81 operates at a higher clock rate than the testing system. Response analyzer 84 collapses into an output signature which in one embodiment is serially shifted out on an external pin at a lower clock rate than stimulus generator 81 for verification by the tester.

In one embodiment of the present invention, clock generator 85, stimulus generator 81, and response analyzer 84 are all external to CUT 83, and are contained in the scribe grid of the wafer on which CUT 83 resides. By placing the testing circuitry in the scribe grid, the effective usable die area is increased. Additionally, multiple die may be tested using the same testing circuitry. The variable frequency control afforded by clock generator 85 overcomes one of the major drawbacks in wafer level testing, the need for high speed testing on a limited frequency tester.

In another embodiment of the present invention, all of the components illustrated in FIG. 14 are resident on the die, allowing the testing methods of the present invention to be applied beyond wafer level testing. Placing the test circuitry on the die has a cost in the usable area of the die, however the present invention offers an enhanced built-in-self-test (BIST). Additionally, containment within the die allows for customer use of the test circuitry, which is beneficial for analysis in the field, as well as confirmation testing. Another advantage of having the elements contained in the die is the reduced number of vectors necessary for later testing.

Still another wafer level embodiment of the present invention has the current monitor 86 external to CUT 83. Stimulus generator 81 and clock generator 85 are both contained within the die. In one embodiment of the present invention, implementation of response analyzer 84 within the die allows disabling of all circuit under test outputs, as illustrated in FIG. 9. The reduced current consumed by CUT 83 during test results in smaller switches and reduced costs.

The present invention offers a flexible method of testing die utilizing the quiescent current measurements and analysis and incorporating the expendable area of the scribe grid at wafer level. In one embodiment of the present invention, the expendable area of the die, namely the corner portions which are not bonded out, are incorporated into the test circuitry. Alternate embodiments incorporate combinations and configurations consistent with the present invention.

Operation of the Present Invention

According to the present invention, defective circuit detection is accomplished through observation of voltage decay with respect to time. The voltage observed is the decaying capacitive voltage of the power supply. The associated quiescent IDD current, IDDQ, is a function of the decay of the voltage Vdd and the time of that delay. The present invention utilizes a pseudo power supply voltage, PVdd, supplied to a switch, as illustrated in FIG. 2. In one embodiment of the present invention, testing is resident on die 5. PVdd is supplied to monitor unit 10 from the circuit under test. During normal operations switch 20 is OFF and no voltage supplied to monitor unit 10 from pad PVdd 4. During normal operations supply voltages are supplied to pad Vdd 6. Normal operation indicates functional testing of die 5, not including quiescent current testing.

The present invention offers a method of monitoring the quiescent Idd which utilizes PVdd supplied from pad PVdd 4 and switch 20. Test unit 8 provides an activation signal to monitor unit 10. During probe the activation signal will be provided to pad ACT 2 from the tester, and from pad ACT 2 is then provided to test monitor unit 10. In one embodiment of the present invention the activation signal is a low active signal.

Assertion of the activation signal is illustrated in FIG. 11 at time $t_1$. Note that when the activation signal is asserted, switch 20 transitions OFF. During this time there will be a wait period which is indicated by looking at sample window in FIG. 11. The sample window indicates the time at which MONOUT is to be strobed. As in the first example illustrated in FIG. 11, a high monitor signal, MONOUT, coincident with the sample window indicates that the quiescent IDD of die 5 is greater than the IDDQ threshold and there is some type of a defect in die 5.

As illustrated in FIG. 2, monitor unit 10, in one embodiment, is not resident on die 5, and may be any of monitor units 60, 61, 62, 63 as illustrated in FIG. 3. Note that monitor unit 10 is enabled between system clock transitions by the activation signal, and during high activation signals, test patterns are applied as input to die 5. Once the activation signal transitions low, the monitoring function of monitor unit 10 begins. At the beginning of such a monitoring cycle, power is disconnected from Vdd by switch 20. Note that switch 20 in this embodiment of the present invention is a P-channel switch transistor. In the presence of a quiescent Idd fault Vdd decays through the anomalous current path. The amplifier stage serves to amplify the difference between Vdd and PVdd. And where there is an IDDQ fault, level detector 26 pulses high to SET latch 28. Latch 28 then turns switch 20 on to prevent further drops in Vdd. Normal IDDQ testing will fail a die on first pattern high IDDQ current. It is advantageous during debug modes to restore Vdd to PVdd level and test additional states of the circuit under test. A defective die may have only one or a few patterns that fail IDDQ current testing. The rising edge of the activation signal then terminates the monitoring cycle. At this point latch 28 RESETs in preparation for the next monitoring cycle. Also note that PVdd receives full power during clock transitions whether latch 28 is SET or RESET.

Referring to FIG. 3 monitor unit 10 in the above discussion may be duplicated in each of the monitors 60, 61, 62 and 63. In this way multiple switches are implemented in parallel. Note that one monitor switch, such as switch 20, is desirable for each internal supply voltage pad. Note that VLSI chips will generally require multiple monitor switches. For use of a minimal number of switches satisfying die area constraints, switch 20 could be implemented as a parallel large P-channel device and a shunt diode. This combination would limit the voltage difference between PVdd and Vdd during an IDDQ pattern application.

Note that additional bond pads can be added in the corners of a die. Typically three pads can be added to each corner for a total of 12 pads per die. Such corner pads are not bonded out in the package but are used strictly for wafer probe. As in FIG. 2, corner pads can be used for ACT 2, MONOUT 3, and PVdd 4. An alternate embodiment illustrated in FIG. 4 utilizes the scribe grid to provide areas for pads ACT 2, MONOUT 3, and PVdd 4. According to FIG. 4, ACT 2 corresponds to activation pad 40, MONOUT 3 corresponds to MONOUT 38 and PVdd 4 to PVdd 32, 30 and 50. One advantage of the embodiment illustrated in FIG. 4 is that the circuit is complete within itself, including all required pads, and may be used to test other die on the wafer.

Switch 20, as well as the activation and monitor signals, can be implemented on die or in the scribe by breaching the top level of metal through the edge seal. One embodiment of an implementation where the die is connected to the monitoring unit through metal on the wafer is illustrated in FIG. 5. Here only those pads associated with the quiescent testing are connected to monitor unit 10. Note that monitor unit 10 is contained within the expendable area of the wafer, while the pads associated with quiescent current testing, namely ACT 2, MONOUT 3, PVdd 4, Vdd 6, and GND 7, are all contained within die 5. Additionally, note that some of the pads contained within die 5 are contained in the expendable portions of die 5. With this implementation it is possible to perform both a relaxed normal test and an IDDQ test, allowing probe testing with the same test hardware. Here power is applied to the chip through switch 20 and switch 20 could be forced on during the relaxed normal test. Note that relaxed normal testing allows slower output transitions.

In one embodiment of the present invention illustrated in FIGS. 6, 7 and 8, monitor unit 10 is contained on die 71. Note that die 71 contains test group 68 which is illustrated in FIG. 7. For this embodiment switch 20 is implemented by using the output buffers associated with pads 23 to 27. Note that the use of switches 31 to 33 reduces the need for switch 20 which is typically the largest spatial portion of monitor unit 10. This also allows use of the output pads 23 to 27 in the place of PVdd pads that were necessary in the embodiment illustration of FIG. 2. In the embodiment illustrated in FIG. 6, the monitor unit is contained within die 71.

Referring to FIG. 7, ACT 55 is used to provide activation signal to monitor unit 67. Note that monitor unit 67 is similar to monitor unit 10, however, switch 20 included in monitor unit 10 is not necessary in monitor unit 67. Monitor unit 67 receives an IDDQ mode signal from IDDQ mode pad 49. IDDQ mode signal also determines the functioning of MUXs 45 through 47. In effect, the IDDQ mode signal determines if quiescent IDD current testing will be done or if normal functioning of the output ports will be implemented. In this case a switch 20 equivalent is implemented using the output buffers, however, the functioning of monitor unit 67 remains unchanged and the timing is according to FIG. 11. Note that the only difference in this implementation of the present invention is that monitor unit 67 is resident on die 71 and for switches it utilizes the output buffers 23 to 27.

In order to save space on die 5 as illustrated in FIG. 13 it is desirable to have all of the additional monitoring pads contained in the scribe of the wafer. Referring to FIG. 4., IDDQ scribe grid unit 51, in one embodiment, contains all of the monitoring functional pads in the scribe. Implementation of IDDQ scribe grid unit 51 as illustrated in FIG. 4 would be according to FIG. 13, where probe needles make the necessary connections between the pads contained in IDDQ scribe grid unit 51 and any corresponding pads on the CUT. FIG. 13 illustrates probe card 101, which provides monitoring supply voltages and signals as well as strobe signals to die 5 and monitors 60 to 63. Here monitors 60 to 63 are configured to IDDQ scribe grid unit 51 as illustrated in the embodiment illustrated in FIG. 4.

Many of the benefits of the present invention are seen at probe or wafer level testing. Referring again to FIG. 3, alternate embodiments of the present invention incorporate a single monitor unit for testing of a single die, or may incorporate multiple monitor units positioned on at least one side a die for testing a single die. For example, depending on the test requirements, desired coverage, geometry of die 72, dimensions of wafer 70, and other restrictions, die 72 may be tested by monitor 62 alone, or by monitor 62 and any combination of monitors 61, 62, and/or 63. Additionally, monitor units may have application to multiple die, where monitor units are "reused" for subsequent testing of other die on wafer 70. According to one embodiment of the present invention, monitor 63 is available for testing die 72 and is available for testing die 74.

The present invention offers a method of streamlining the test process by combining the monitor unit with the functional testing hardware. One embodiment of such an application of the present invention is illustrated in FIG. 14. For functional testing of CUT 83, patterns are prestored in stimulus generator 81 or provided by data input. Stimulus generator provides the test patterns in a reduced form to CUT 83. The patterns applied to CUT 83 will have a resultant output which is provided to response analyzer 84, which then provides data out, which may be processed by the test system. Note that Vdd is provided to CUT 83 from current monitor 86.

In the embodiment illustrated in FIG. 14, clock generator 85 independently provides a clock signal to CUT 83. Alternate frequency is then available for testing CUT 83 at a higher frequency than is available from the tester at probe. Test system 80 of FIG. 14 offers the advantages of combining quiescent IDD testing with functional testing in a single test environment, coupled with the ability to vary the test frequency to higher levels than available within the test environment. Testers and test environments are made flexible and last longer, eliminating the need to purchase new test equipment for increasingly high speed devices.

According to one aspect of the present invention a test system includes a first die integrated on a first portion of a wafer; a monitor circuit integrated on a second portion of the wafer wherein the second portion of the wafer is separate from the first portion of the wafer, the monitor circuit performing a test operation which verifies a specified functional operation of the first die, wherein the test operation measures a current drawn by the first die; and a test device which is coupled to the first die and to the monitor circuit to selectively enable the monitor circuit to perform the test operation which verifies the specified functional operation of the first die. The second portion of the wafer is integrated in an expendable portion of the wafer. The test device further includes a test connector for providing an activation signal and a supply voltage value to the monitor circuit to enable the monitor circuit to perform the test operation. In one mode, the test operation measures a current drawn by the first die and determines when the first die conforms with a predetermined specification or if the first die includes a manufacturing defect. The test operation may verify a functional integrity of the first die.

According to another aspect of the present invention, a die includes an integrated circuit, a current monitor circuit and a stimulus generator. The current monitor circuit has a voltage controlled current switch and is adapted to perform a first test operation to verify an intended operation of the integrated circuit. The first test operation then measures a current drawn by the first die to determine a first current measurement and uses the first current measurement to verify a functional integrity of the first die. The stimulus generator is adapted to apply a set of test signals internal to the integrated circuit.

The present invention utilizes the expendable areas of the die and wafer for implementing the quiescent current testing. In one embodiment of the present invention, corner pads are utilized for testing pads, where such corner space is expendable and not to be bonded out in the package. The present invention may be implemented using prior art monitor circuits positioned within the scribe grid of the wafer. Note that the scribe grid area is typically quite large compared to pad size and to circuit sizes. Additionally, improvements, alterations, and changes to the monitor unit may be implemented easily without changing die design.

The present invention offers a method of wafer probe reducing the number of vectors required for testing, as well as the use of multiple current monitors per die for redundancy. The present invention does not preclude normal testing, where the monitor is easily eliminated from the test circuit by applying power directly to Vdd rather than supplying power through the monitor circuit.

The present invention incorporates methods of using quiescent current testing to determine if a die conforms to a predetermined specification, or detect any defects in a die, or to verify functional integrity of a die.

We claim:

1. A wafer, comprising:
   a first die integrated on a first portion of the wafer;
   a second die integrated on a fourth portion of the wafer;
   a first monitor circuit integrated on a second portion of the wafer wherein the second portion of the wafer is separate from the first portion of the wafer, the first monitor circuit performing a first test operation which verifies an intended operation of the first die wherein the first test operation measures a current drawn by the first die to determine a first current measurement and uses the first current measurement to verify a functional integrity of the first die;
   a second monitor circuit integrated on a third portion of the wafer, wherein the third portion of the wafer is separate from the first portion and the second portion of the wafer, the second monitor circuit performing a second test operation which verifies an intended operation of the second die, wherein the second test operation measures a current drawn by the second die to determine a second current measurement and uses the second current measurement to verify a functional integrity of the first die.

2. The wafer of claim 1, wherein the first test operation measures a quiescent current (IDDQ) drawn by the first die.

3. The wafer of claim 1, wherein the second portion and the third portion of the wafer are on a scribe grid of the wafer.

4. The wafer of claim 1, wherein the second portion and the third portion of the wafer are expendable portions of the wafer.

5. The wafer of claim 1, wherein the first die, comprises:
   an integrated circuit; and
   a connector for interfacing the integrated circuit to the first monitor circuit.

6. The wafer of claim 5 wherein the connector is an integrated circuit pad.

7. The wafer of claim 6, wherein the at least one integrated circuit pad is not functionally related to operation of the integrated circuit.

8. The wafer of claim 5, wherein the connector is an electrical conductor.

9. The wafer of claim 1, wherein the first monitor circuit is integrated between the first die and the second die.

10. The wafer of claim 9 wherein the first monitor circuit performs a third test operation which verifies an intended operation of the second die.

11. A test system, comprising:
    a first die integrated on a first portion of a wafer;
    a monitor circuit integrated on a second portion of the wafer wherein the second portion of the wafer is separate from the first portion of the wafer, the monitor circuit performing a test operation which verifies a specified functional operation of the first die, wherein the test operation measures a current drawn by the first die; and
    a test device which is coupled to the first die and to the monitor circuit to selectively enable the monitor circuit to perform the test operation which verifies the specified functional operation of the first die.

12. The test system of claim 11, wherein the second portion of the wafer is integrated in an expendable portion of the wafer.

13. The test system of claim 11, wherein the test device further comprises:
    a test connector for providing an activation signal and a supply voltage value to the monitor circuit to enable the monitor circuit to perform the test operation.

14. The test system of claim 13, wherein the test operation measures a current drawn by the first die.

15. The test system of claim 13, wherein the test operation determines when the first die conforms with a predetermined specification.

16. The test system of claim 13, wherein the test operation determines when the first die includes a manufacturing defect.

17. The test system of claim 13, wherein the test operation verifies a functional integrity of the first die.

18. A method for executing a test operation, comprising the steps of:
    integrating a first die on a first portion of a wafer;
    integrating a monitor circuit on a second portion of the wafer wherein the second portion of the wafer is separate from the first portion of the wafer; and
    enabling the monitor circuit to perform a test operation which measures a current drawn from the first die to verify an intended operation of the first die.

19. The method of claim 18 wherein a test device performs a step of enabling the monitor circuit to perform the test operation.

20. The method of claim 18, wherein the second portion of the wafer is an expendable portion of the wafer.

21. The method of claim 20, wherein the test operation is a quiescent current measurement operation.

22. The method of claim 21, further comprising the steps of:
    initializing the first die to a known state, wherein the known state includes a known operating voltage; and
    measuring a quiescent current drawn by the first die.

23. The method of claim 22, wherein a step of measuring the quiescent current drawn by the first die, comprises the steps of:
    disabling a switch to remove the known operating voltage provided to the first die; and
    monitoring a decay of the known operating voltage on the die to determine whether the first die discharges an excessive amount of current.

24. A data processor, comprising:
    control means for providing a mode control signal to indicate when the data processor operates in a first mode and a second mode of operation;
    an output buffer coupled to the control means for receiving the mode control signal and the output buffer receiving a known operating voltage, a portion of the output buffer providing a signal externally when the mode control signal indicates the data processor operates in the first mode of operation and the portion of the output buffer removing the known operating voltage provided to the data processor when the mode control signal indicates the data processor operates in the second mode of operation; and monitoring means for monitoring a decay of the known operating voltage to determine whether the data processor discharges an excessive amount of current.

25. The data processor of claim 24, wherein the first mode of operation is a normal mode of operation and the second mode of operation is a test mode of operation.

26. The data processor of claim 25, further comprising:

a first plurality of integrated circuit pads, the first plurality of integrated circuit pads being used for the second mode of operation, the first plurality of integrated circuit pads being expendable in the second mode of operation.

27. The data processor of claim 24 wherein the portion of the output buffer is a pull-up transistor.

28. A method for testing a data processor, comprising the steps of:

receiving a known operating voltage at an output buffer;

providing a mode control signal to indicate when the data processor operates in a first mode and a second mode of operation using a mode control circuit;

enabling a portion of the output buffer to provide a signal externally when the mode control signal indicates the data processor operates in the first mode of operation;

enabling the portion of the output buffer to remove the known operating voltage provided to the data processor when the mode control signal indicates the data processor is operating in the second mode of operation; and monitoring a decay of the known operating voltage to determine whether the data processor discharges an excessive amount of current.

29. The data processor of claim 28 wherein the first mode of operation is a normal mode of operation and the second mode of operation is a test mode of operation.

30. The data processor of claim 28 wherein the portion of the output buffer is a pull-up transistor.

31. A wafer, comprising:

a pattern generator for providing an input stimulus, the pattern generator being integrated on a first portion of the wafer;

a circuit to be tested coupled to the pattern generator to receive the input stimulus, the circuit to be tested providing an output which is a specified function of the input stimulus, the circuit to be tested being integrated on a second portion of the wafer wherein the second portion of the wafer is separate from the first portion of the wafer; and a signature analyzer coupled to the circuit to be tested to receive the output, the signature analyzer verifies the output is correct, the signature analyzer being integrated on the second portion of the wafer.

32. The data processor of claim 31 wherein the pattern generator is a linear feedback shift register.

33. The data processor of claim 31 wherein the signature analyzer is a linear feedback shift register.

34. A wafer, comprising:

at least one die; and a current monitor circuit external to the at least one die, the current monitor circuit having a voltage controlled current switch, the current monitor circuit performing a first test operation which verifies an intended operation of the at least one die, wherein the first test operation measures a current drawn by the at least one die to determine a first current measurement and uses the first current measurement to verify a functional integrity of the first die.

35. A wafer as in claim 34, wherein the at least one die is capable of receiving a clock signal from external to the at least one die.

36. A wafer as in claim 35, further comprising a clock generator external to the at least one die, the clock generator providing the clock signal to the at least one die.

37. A wafer as in claim 36, wherein the clock generator is a phase locked loop.

38. A wafer as in claim 36, the clock generator having a variable output associated with an input signal.

39. A wafer as in claim 37, further comprising a signal generator external to the at least one die, the signal generator providing signals to the at least one die.

40. A wafer as in claim 39, further comprising a response analyzer external to the at least one die, the response analyzer receiving signals from the at least one die.

41. A wafer as in claim 40, wherein the signal generator and the response analyzer are linear feedback shift register.

42. A wafer as in claim 34, further comprising a test stimulus generator within the at least one die, the test stimulus generator providing test signals internal to the at least one die.

43. A wafer as in claim 42, further comprising a clock generator.

44. A wafer as in claim 43, further comprising a response analyzer circuit.

45. A die comprising:

an integrated circuit;

a current monitor circuit having a voltage controlled current switch, the current monitor circuit performing a first test operation which verifies an intended operation of the integrated circuit, wherein the first test operation measures a current drawn by the first die to determine a first current measurement and uses the first current measurement to verify a functional integrity of the first die; and a stimulus generator, the stimulus generator applying a set of test signals internal to the integrated circuit.

46. A die as in claim 45, wherein the die further comprises:

a response analyzer, the response analyzer receiving a set of response signals resultant from the set of test signals applied internal to the integrated circuit.

47. A die as in claim 46, wherein the die further comprises:

a clock generator, the clock generator providing a clock signal to the stimulus generator and to the response analyzer.

* * * * *